(12) United States Patent
Lin et al.

(10) Patent No.: US 7,813,100 B2
(45) Date of Patent: Oct. 12, 2010

(54) DEMAGNETIZATION CIRCUIT OF A MOBILE PHONE

(75) Inventors: Yi-Fang Lin, Taipei County (TW); Hsi-Chieh Chen, Taipei County (TW)

(73) Assignee: Chi Mei Communication Systems, Inc., Tu-Cheng City, Taipei County (TW)

( * ) Notice: Subject to any disclaimer, the term of this patent is extended or adjusted under 35 U.S.C. 154(b) by 0 days.

(21) Appl. No.: 12/348,639

(22) Filed: Jan. 5, 2009

(65) Prior Publication Data

US 2010/0067162 A1    Mar. 18, 2010

(30) Foreign Application Priority Data

Sep. 17, 2008    (CN) .................... 2008 1 0304539

(51) Int. Cl.
*H01F 13/00*    (2006.01)
(52) U.S. Cl. ...................................... 361/149
(58) Field of Classification Search .................. 361/149
See application file for complete search history.

(56) References Cited

U.S. PATENT DOCUMENTS

| | | | |
|---|---|---|---|
| 3,784,868 A * | 1/1974 | Shinkai et al. ................. | 315/8 |
| 5,282,252 A * | 1/1994 | Orban ........................ | 381/98 |
| 2006/0064037 A1* | 3/2006 | Shalon et al. ............... | 600/586 |
| 2008/0297404 A1* | 12/2008 | Lin et al. .................... | 342/195 |

* cited by examiner

*Primary Examiner*—Jared J Fureman
*Assistant Examiner*—Ann T Hoang
(74) *Attorney, Agent, or Firm*—D. Austin Bonderer

(57) ABSTRACT

A demagnetization circuit for reducing interference in a mobile phone includes a wave filter, a demagnetization circuit and an audio playing circuit. The wave filter is configured to filter a received audio signal from the mobile phone. The wave filter includes an input that receives the audio signal, and an output. The demagnetization circuit is structured and arranged to generate an opposite magnetic field to that of the mobile phone to reduce pulse magnetic fields generated by the mobile phone.

9 Claims, 2 Drawing Sheets

DEMAGNETIZATION CIRCUIT OF A MOBILE PHONE

BACKGROUND

1. Technical Field

The present disclosure relates to a demagnetization circuit for use in a mobile phone.

2. Description of the Related Art

Mobile phones generate pulse magnetic fields. These pulse magnetic fields may cause a loud interfering noise in hearing aids and cochlear implants of mobile phone users. The noise may be a buzzing sound that makes speech hard to understand.

What is needed, therefore, is a system which can overcome the above-described problem.

BRIEF DESCRIPTION OF THE DRAWINGS

Many aspects of the present demagnetization circuit should be better understood with reference to the accompanying drawings. The components in the drawings are not necessarily drawn to scale, the emphasis instead being placed upon clearly illustrating the principles of the demagnetization circuit. Moreover, in the drawings, like reference numerals designate corresponding parts throughout the several views.

DETAILED DESCRIPTION

Embodiments of the present demagnetization circuit will now be described in detail with reference to the drawings.

Figure 1:
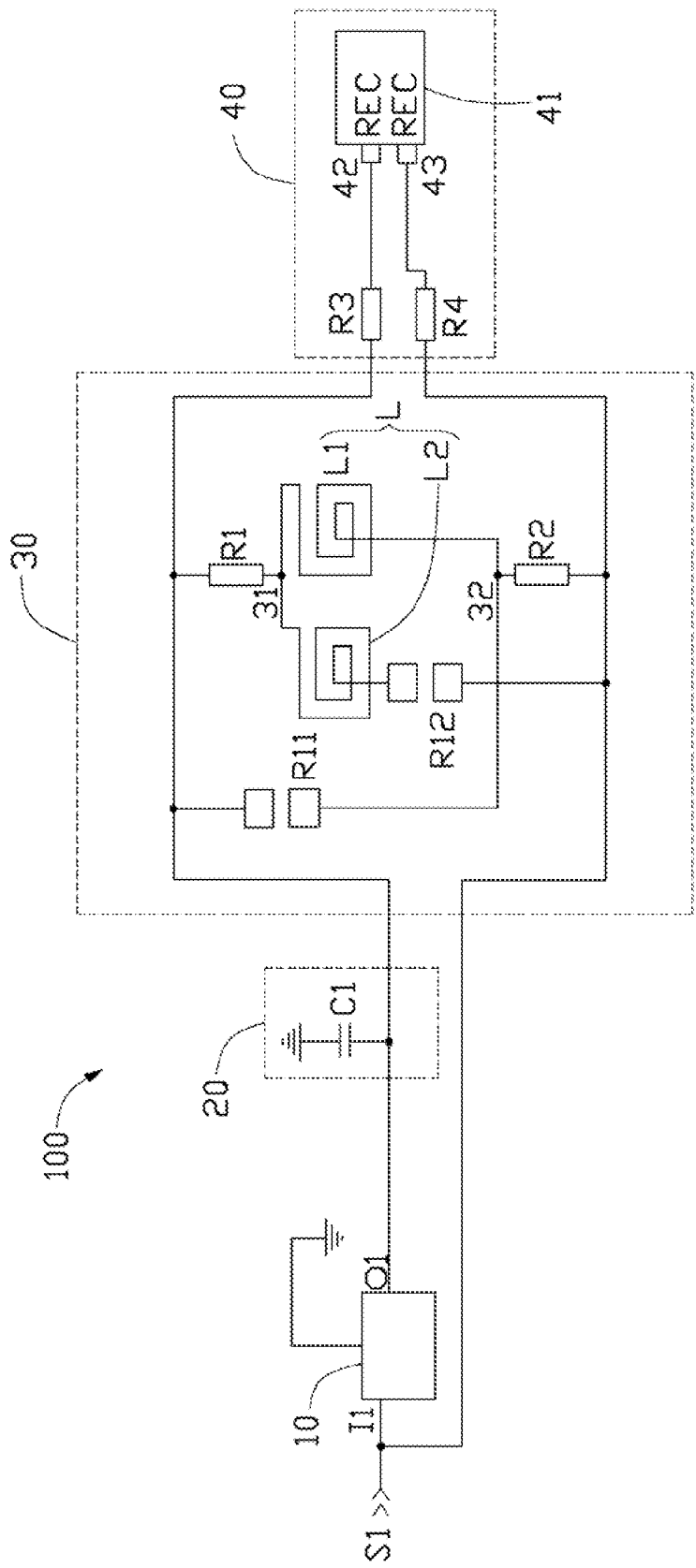
FIG. 1 is a schematic view of a mobile phone including a demagnetization circuit in accordance with an exemplary embodiment.
Figure 2:
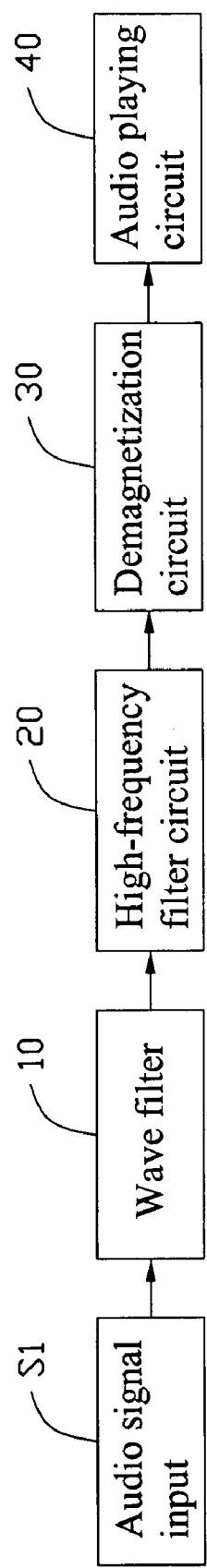
FIG. 2 is a functional block diagram of the mobile phone of FIG. 1.

Referring to FIGS. 1-2, a schematic view of a mobile phone 100 is shown. The mobile phone 100 includes an audio signal input S1, a wave filter 10, a high-frequency filter circuit 20, a demagnetization circuit 30, and an audio playing circuit 40.

The wave filter 10 includes a input I1 coupled to the input signal input S1, a output O1, and a ground. In one exemplary embodiment, the wave filter 10 may be a band-pass filter having a pass band in the range from 20 Hz-20 kHz, the frequency range of human hearing. The wave filter 10 is configured to filter output of the audio signal input S1 to limit the frequency range of the output of the output O1.

The high-frequency filter circuit 20 includes a capacitor C1. The capacitor C1 includes an input coupled to the output O1 of the wave filter 10, and an output coupled to ground. The capacitor C1 is configured for further filtering output of the wave filter at higher frequencies.

The demagnetization circuit 30 is configured for generating magnetic fields in an opposite direction to that of the mobile phone 100. As a result, the demagnetization circuit 30 is capable of removing or reducing pulse magnetic fields generated by the mobile phone 100. In the illustrated embodiment, the demagnetization circuit 30 includes a inductor group L, a first surface mount resistor R11, a second surface mount resistor R12, a first resistor R1, and a second resistor R2. In this embodiment, the inductor group L includes a first inductor L1 and a second inductor L2. The first and second inductors L1, L2 are wound in the same direction and are positioned parallel to each other. One end of the first resistor R1 is coupled to the input of the capacitor C1, and the other end is coupled to the first junction 31 of the first inductor L1 and the second inductor L2. One end of the first surface mount resistor R11 is connected to the input of the capacitor C1, and the other end is coupled to the second inductor L2. One end of the second resistor R2 is coupled to the second junction 32 of the first inductor L1 and the first surface mount resistor R11, the other end is coupled to the output of the surface mount resistor R12. The other end of the second surface mount resistor R12 is coupled to the second inductor L2.

The audio playing circuit 40 includes a third resistor R3, a fourth resistor R4 and an audio player 41 configured for receiving the audio signal and transforming the audio signal into a sound. The audio player 41 includes a first connection 42 and a second connection 43. One end of the third resistor R3 is coupled to the input of the capacitor C1, and the other end is coupled to the first connection 42 of the audio player 41. One end of the fourth resistor R4 is coupled to the input of the wave filter, and the other end is coupled to the second connection 43 of the audio player 41.

Tests are carried out in three situations to demonstrate that the magnetic fields are reduced by the demagnetization circuit 30 of the present disclosure. In a first exemplary situation, the electrical connections among the first and second surface mount resistor R11, R12, as well as the first resistor R1 are broken, as a result, the demagnetization circuit 30 become disabled. Strength of the magnetic fields are measured and recorded during operation of the mobile phone 100. In the first exemplary situation, the magnetic field measures about 100 gauss (G). In general, it will product interfering noise when the strength of the magnetic field excesses 90 G.

In a second exemplary situation, the first resistor R1, and second resistor R2 are electrically connected, but the first surface mount resistor R11 and second surface mount resistor R12 are broken. The input of the wave filter 10 receives the audio signal S1, the output O1 outputs a first signal to the high-frequency filter circuit 20 to filter out high-frequency signal interference, then the first signal is divided into two parts with one part going to the first inductor L1 via the first resistor R1, and the other part going to the first input 42 of the audio player 41 via the third resistor R3 to drive the audio player 41. The first signal flows through the first inductor L1 via the first resistor R1 and generates a directional magnetic field, where the strength of the magnetic field is recorded. Assuming that the magnetic field generated by the mobile phone 100 and the first inductor L1 total about 120 G, 20 G for the first inductor L1 and 100 for the phone, and the direction of the magnetic fields are the same and so are additive.

In a third exemplary situation, the first surface mount resistor R11, the second surface mount resistor R12, the first resistor R1, and the second resistor R2 are electrically connected. The first signal flows through the first inductor L1 via the first surface mount resistor R11, then flows through the second inductor L2. Because the first and second inductors L1, L2 are arranged in parallel with their windings in the same direction, their magnetic fields are additive. However, the direction of magnetic fields of the inductors is opposite to that of the phone and so can be subtracted from magnetic field of the phone. This gives 20 G+20 G for the inductors subtracted from 100 G for the phone for an overall field strength of about 60 G Therefore, field strength generated from operation of the phone is reduced approximately by half resulting in greatly reduced interference to hearing aids etc. of users. In manufacture, strength of the magnetic fields of the inductors can obviously be adjusted by adjusting the number of turns in the inductors, the length of the inductors, and the amount of current supplied as needed.

It will be understood that the above particular embodiments and methods are shown and described by way of illustration only. The principles and the features of the present invention may be employed in various and numerous embodiment thereof without departing from the scope of the invention as claimed. The above-described embodiments illustrate the scope of the invention but do not restrict the scope of the invention.

What is claimed is:

1. A demagnetization circuit of a mobile phone for reducing interference, comprising:
    a wave filter configured to filter a received audio signal from the mobile phone, the wave filter comprising an input to receive the audio signal and an output;
    a high frequency circuit configured to filter high frequencies of the filtered audio signal, the high frequency circuit comprises a capacitor;
    the demagnetization circuit structured and arranged to generate an opposite magnetic field to that of the mobile phone to reduce pulse magnetic fields generated by the mobile phone, wherein the demagnetization circuit comprises a first inductor and a second inductor wound in the same direction, the demagnetization circuit further comprises a first surface mount resistor, a second surface mount resistor, a first resistor and a second resistor, one end of the second resistor is coupled to a junction of the first inductor and the first surface mount resistor, the other end is coupled to the second surface mount resistor, the other end of the second surface mount resistor is coupled to the second inductor; and
    an audio playing circuit comprising an audio player, the audio player comprising a first connection and a second connection, the first connection coupled to the output of the wave filter, and second connection coupled to the input of the wave filter, one end of the first resistor is coupled to the input of the capacitor, and the other end is coupled to a junction of the first inductor and second inductor, one end of the first surface mount resistor is coupled to the capacitor, and the other end is coupled to the first inductor.

2. The demagnetization circuit of a mobile phone as claimed in claim 1, wherein the wave filter is a band-pass filter having a pass band in the range from 20Hz-20KHz.

3. The demagnetization circuit of a mobile phone as claimed in claim 1, wherein the audio playing circuit further comprises a third resistor and a fourth resistor, the first connection is coupled to the output of the wave filter via the third resistor, and second connection coupled to the input of the wave filter via the fourth resistor.

4. A demagnetization circuit of a mobile phone, comprising:
    a wave filter configured to filter a received audio signal from the mobile phone, the wave filter comprising an input to receive the audio signal and an output;
    a high frequency circuit including a capacitor;
    the demagnetization circuit structured and arranged to generate an opposite magnetic field to that of the mobile phone to reduce pulse magnetic fields generated by the mobile phone, the demagnetization circuit including a first inductor, a second inductor, a first surface mount resistor and a second surface mount resistor, the first inductor and the second inductor wound in the same direction; one end of the first surface mount resistor coupled to the capacitor, and the other end coupled to the first inductor; one end of the second surface mount resistor coupled to the second inductor; and
    an audio playing circuit comprising an audio player, the audio player comprising a first connection and a second connection, the first connection coupled to the output of the wave filter, and second connection coupled to the input of the wave filter, the other end of the second surface mount resistor coupled to the second connection.

5. The demagnetization circuit of a mobile phone as claimed in claim 4, wherein the wave filter is a band-pass filter having a pass band in the range from 20Hz-20KHz.

6. The demagnetization circuit of a mobile phone of claim 4, the demagnetization circuit further comprises a first resistor and a second resistor, one end of the first resistor is coupled to the input of the capacitor, and the other end is coupled to a junction of the first inductor and the second inductor, one end of the second resistor is coupled to a junction of the first inductor and the first surface mount resistor, the other end is coupled to the second surface mount resistor, the second surface mount resistor is coupled to the second inductor.

7. The demagnetization circuit of a mobile phone as claimed in claim 4, wherein the audio playing circuit further comprises a third resistor and a fourth resistor, the first connection coupled to the output of the wave filter via the third resistor, and second connection coupled to the input of the wave filter via the fourth resistor.

8. A demagnetization circuit of a mobile phone, comprising:
    a wave filter configured to filter a received audio signal from the mobile phone, the wave filter including an input to receive the audio signal and an output;
    a high frequency circuit including a capacitor;
    the demagnetization circuit including a first inductor, a second inductor, a first resistor and a second resistor, the first inductor and the second inductor wound in the same direction; one end of the first resistor coupled to the capacitor, and the other end coupled to a junction of the first inductor and the second inductor; one end of the second resistor coupled to the first inductor; and
    an audio playing circuit comprising an audio player, the audio player including a first connection and a second connection, the first connection coupled to the output of the wave filter, and second connection coupled to the input of the wave filter, the other end of the second resistor coupled to the second connection.

9. The demagnetization circuit of a mobile phone of claim 8, the demagnetization circuit further comprises a first surface mount resistor and a second surface mount resistor, one end of the first surface mount resistor is coupled to the capacitor, and the other end is coupled to the first inductor, one end of the second resistor is coupled to a junction of the first inductor and the first surface mount resistor, the other end is coupled to the second surface mount resistor, the other end of the second surface mount resistor is coupled to the second inductor.

* * * * *